(12) United States Patent
Cress et al.

(10) Patent No.: US 6,292,013 B1
(45) Date of Patent: Sep. 18, 2001

(54) COLUMN REDUNDANCY SCHEME FOR BUS-MATCHING FIFOS

(75) Inventors: Daniel Eric Cress; Derrick Savage, both of Starkville, MS (US); Pidugu L. Narayana, Sunnyvale, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/396,024

(22) Filed: Sep. 15, 1999

Related U.S. Application Data

(60) Provisional application No. 60/102,131, filed on Sep. 28, 1998.

(51) Int. Cl.[7] .................................................. H03K 19/003
(52) U.S. Cl. .................................. 326/10; 326/37; 326/41
(58) Field of Search ..................................... 326/10, 41, 37, 326/56, 82, 86

(56) References Cited

U.S. PATENT DOCUMENTS 3,473,160 * 10/1969 Wahlstrom ............................. 326/39
5,689,195 * 11/1997 Cliff et al. ............................. 326/41

\* cited by examiner

*Primary Examiner*—Michael Tokar
*Assistant Examiner*—Anh Tran
(74) *Attorney, Agent, or Firm*—Christopher P. Maiorana, P.C.

(57) ABSTRACT

A circuit and method comprising a multiplexer circuit, a select circuit and a buffer circuit. The multiplexer circuit may be configured to present a data bit in response to a first control signal. The select circuit may be configured to generate one or more first outputs in response to (i) the data bit and (ii) one or more first select signals. The buffer circuit may be configured to present one or more second outputs on a data bus in response to (i) the one or more first outputs and (ii) one or more second control signals. One of the second outputs may have a data state and the rest of the second outputs may have a high impedance state. The first and select signals may be generated by a logic circuit.

20 Claims, 1 Drawing Sheet

COLUMN REDUNDANCY SCHEME FOR BUS-MATCHING FIFOS

This application claims the benefit of U.S. Provisional Application No. 60/102,131, filed Sep. 28, 1998 and is hereby incorporated by reference in its entirety.

FIELD OF THE INVENTION

The present invention relates to memories generally and, more particularly, to a column redundancy scheme for bus-matching FIFOs.

BACKGROUND OF THE INVENTION

Column redundancy is used in the fabrication of memory devices to improve the overall yield of the fabrication process. If a column, or a number of columns, are found to be defective during the testing of the device, one or more redundant columns can be substituted for the defective columns. The substitution allows the device to function properly despite the defective columns.

Bus-matching features, such as those found in co-pending application U.S. Ser. No. 60/102,035, filed on Sep. 28, 1998, which is hereby incorporated by reference in its entirety, make the implementation of column redundancy much more complex than column redundancy in traditional FIFOs.

Conventional column redundancy circuits, which would require fuses to configure a circuit that multiplexes the data into and out of the faulty memory section to enable the redundant column, do not work with the bus-matching circuit of the co-pending application, since there is not generally a layer of multiplexers to implement such fusing.

SUMMARY OF THE INVENTION

The present invention concerns a circuit and method comprising a multiplexer circuit, a select circuit and a buffer circuit. The multiplexer circuit may be configured to present a data bit in response to a first control signal. The select circuit may be configured to generate one or more first outputs in response to (i) said data bit and (ii) one or more first select signals. The buffer circuit may be configured to present one or more second outputs on a data bus in response to (i) said one or more first outputs and (ii) one or more second control signals. One of the second outputs may have a data state and the rest of the second outputs may have a high impedance state. The first and select signals may be generated by a logic circuit.

The objects, features and advantages of the present invention include providing a column redundancy circuit and/or logic that may be implemented in a bus-matching circuit that may (i) use less area to implement by reducing the number of fuses incorporated into the main (non-redundant) datapath, (ii) be implemented independently of the main datapath, therefore incurring little to no impact to an existing datapath layout, and (iii) be less complex to implement by reducing the requirement of a complex fuse architecture and fuse-blowing procedures. The reduction of fuses is particularly useful where the layout is pitch-matched.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
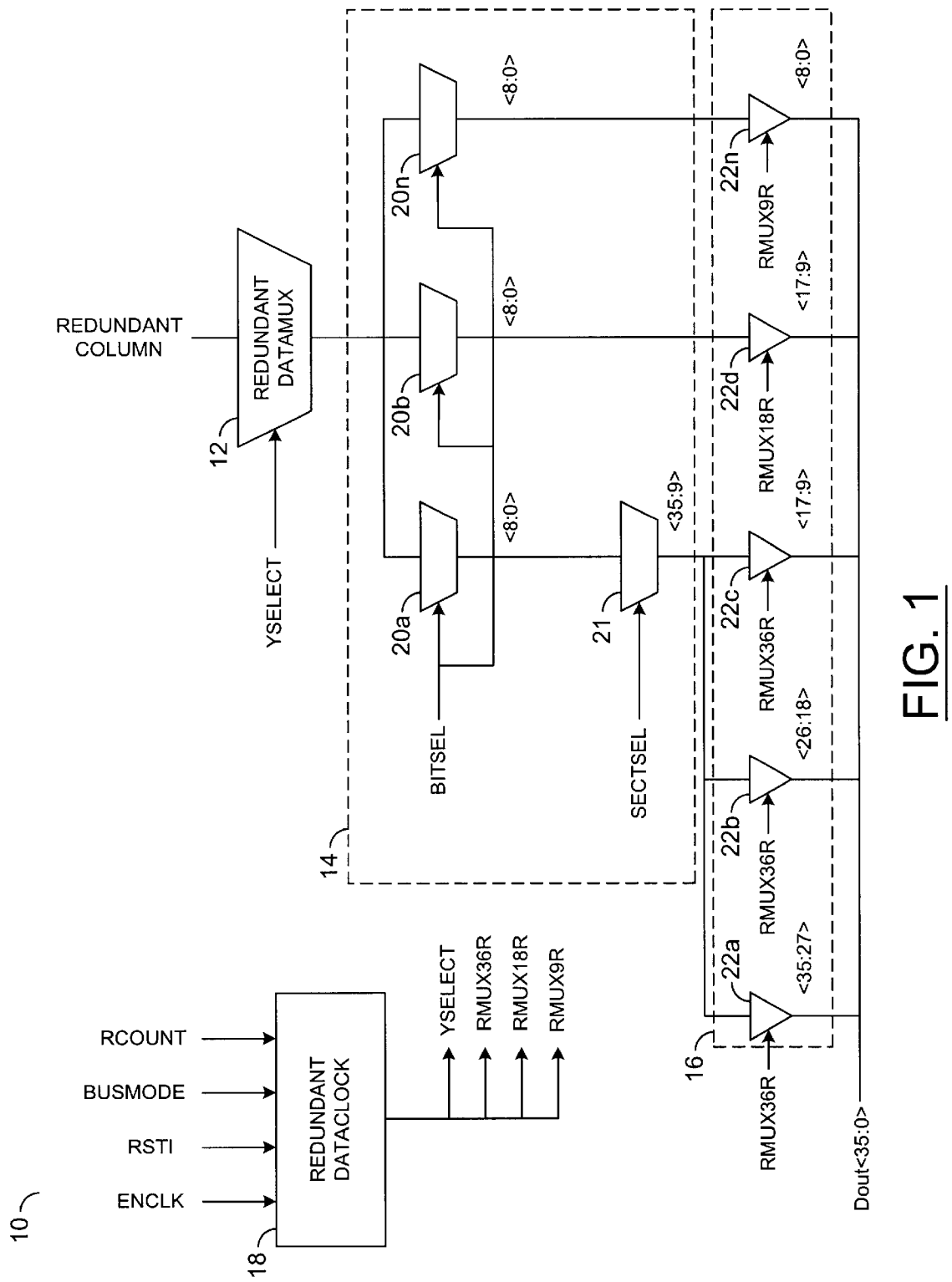
FIG. 1 is a block diagram of a preferred embodiment of the present invention.

The present invention provides a circuit and method by which to guide specific bits of data into and out of the redundant memory column. The present invention may be implemented in a memory, such as in the referenced co-pending application, that offers multiple modes of operation for the datapath. The specific data bit may be directed into/out of the redundant column, depending on (i) the column in memory that is to be replaced and (ii) the datapath's mode of operation. The present invention may provide the flexibility to disable one or more columns and provide one or more redundant datapaths while maintaining successful operation in a number of bus-modes. The new datapath may be incorporated into existing high-speed datapaths.

Referring to FIG. 1, a diagram of circuit 10 is shown in accordance with a preferred embodiment of the present invention. The circuit 10 generally comprises a redundancy multiplexer 12, a select block (or circuit) 14, a buffer block (or circuit) 16 and a logic block (or circuit) 18. The logic circuit 18, in one example, may be a redundant dataclock logic circuit. The circuit 10 illustrates a scheme for read datapath redundancy multiplexing. During operation of a FIFO memory (not shown), a bit may be selected from the memory by a control signal (e.g., YSELECT). The selected bit may then be driven into the redundancy multiplexer 12. A first and a second select signal (e.g., BITSEL and SECTSEC) may select the bit and section of a memory to be replaced. The signals BITSEL and SECTSEC may be binary encoded selection signals.

In one example, the signal BITSEL and the signal SECTSEL may be implemented as binary encoded selection signals. The redundant dataclock logic 18 may present control signals (e.g., RMUX36R, RMUX18R and RMUX9R) that may enable one or more tri-state buffers 22a–22n of the buffer section 16. The redundant dataclock logic 18 may generate the control signal YSELECT in response to one or more input signals (e.g., ENRCLK, RSTI, BUSMODE, RCOUNT, etc.). The tri-state buffers 22a–22n may drive the required bit onto an output datapath (e.g., DOUT<35:0>), depending on (i) the mode of operation and (ii) the bit and section that is replaced. While the circuit 10 generally implements a read-side redundancy circuitry, a write-side redundancy implementation may be implemented as a 'dual' of the circuit 10.

The circuit 10 may write data into a redundant column by setting the signal SECTSEL and the signal BITSEL. The circuit 10 may also read data out of a redundant column by setting the signal SECTSEL and the signal BITSEL. The circuit 10 may direct data directly onto the data output path DOUT<35:0> by using an enable signal (e.g., Redundant Column) in conjunction with the signal BITSEL and the signal SECTSEL. The circuit 10 may direct data directly onto the data output path DOUT<35:0> independently of the existing main datapath.

The signal BITSEL may be implemented, in one example, as a 4-bit signal (e.g., BITSEL<3:0>) and the signal SECTSEL may be implemented as a 3-bit signal (e.g., SECTSEL<2:0>). However, the signals BITSEL and SECTSEL may be implemented as a signal with more bits or fewer bits in order to meet the design criteria of a particular implementation. Three control signals (e.g., RMUX36R, RMUX18R, and RMUX9R) may be generated by the logic block 18 to control the buffers 22a–22n. The logic block 18 used to generate the control signals may be implemented along with the logic that may be used to multiplex the data onto the data bus DOUT<35:0>for non-redundant bits.

The multiplexers 20*a*–20*n* may be implemented as tri-statable multiplexers, where only one of the multiplexers 20*a*–20*n* presents an output (other than a high impedance state) at a time. The multiplexers 20*b* and 20*n* may present signals to the buffers 22*d* and 22*n*. The output of the multiplexer 20*a* may be presented to either the buffer 22*a*, 22*b* or 22*c*, depending on the state of the signal SECTSEL presented to the multiplexer 21. The state of the signal SECTSEL generally depends on the mode of operation of the circuit 10. The buffer block 16 generally only presents a single bit (representing the redundant bit) to the data bus DOUT<35:0>. The remaining bits are generally in a high impedance state. The circuit 10 has been described in a conceptual manner and may be implemented in a discrete logic, a programming language (such as verilog hardware description language (HDL) as defined by the IEEE 1364–1995 standard) or any other appropriate implementation.

While the invention has been particularly shown and described with reference to the preferred embodiments thereof, it will be understood by those skilled in the art that various changes in form and details may be made without departing from the spirit and scope of the invention.

What is claimed is:

1. A circuit comprising:
   a multiplexer circuit configured to present a data bit in response to a first control signal;
   a select circuit comprising a plurality of tri-statable multiplexers configured to generate one or more first outputs having a data state or a high impedance state in response to (i) said data bit and (ii) one or more first select signals; and
   a buffer circuit configured to present one or more second outputs on a data bus in response to (i) said one or more first outputs and (ii) one or more second control signals, wherein one of said second outputs has a data state and one or more of said outputs has a high impedance state.

2. The circuit according to claim 1, further comprising:
   a logic circuit configured to generate said first control signal.

3. The circuit according to claim 2, wherein said logic circuit is configured to control bus-matching of said data bus.

4. The circuit according to claim 1, wherein said select circuit is further configured to present said data bit in response to one or more second select signals.

5. The circuit according to claim 3, wherein said logic circuit is further configured to generate said one or more second control signals.

6. The circuit according to claim 3, wherein said logic circuit is configured to control bus-matching in response to one or more logic control signals.

7. The circuit according to claim 1, wherein said one or more second outputs are configured to provide column redundancy in a bus-matching memory.

8. The circuit according to claim 1, wherein said buffer circuit comprises a plurality of buffers.

9. The circuit according to claim 1, wherein each buffer of said plurality of buffers comprises a tri-state buffer.

10. The circuit according to claim 8, wherein said one or more second control signal enable said plurality of buffers.

11. The circuit according to claim 3, wherein said logic circuit is further configured to multiplex non-redundant data bits onto said data bus.

12. The circuit according to claim 8, wherein said select circuit generates said one or more first outputs and presents said one or more first outputs to one or more of said plurality of buffers.

13. A circuit comprising:
    means for presenting a data bit in response to a first control signal;
    means for generating one or more first outputs having a data state or a high impedance state using a plurality of tri-statable multiplexers in response to (i) said data bit and (ii) one or more first select signals; and
    means for presenting one or more second outputs on a data bus in response to (i) said one or more first outputs and (ii) one or more second control signals, wherein one of said second outputs has a data state and one or more of said outputs has a high impedance state.

14. The circuit according to claim 13, further comprising:
    means for generating (i) said first control signal and (ii) said one or more second control signals.

15. A method for providing column redundancy in a bus-matching memory comprising the steps of:
    (A) presenting a data bit in response to a first control signal;
    (B) generating one or more first outputs using a plurality of tri-statable multiplexers, in response to (i) said data bit and (ii) one or more first select signals, wherein one or more first outputs having a data state or a high impedance state; and
    (C) presenting one or more second outputs on a data bus in response to (i) said one or more first outputs and (ii) one or more second control signals, wherein one of said second outputs has a data state and one or more of said outputs has a high impedance state.

16. The method according to claim 14, further comprising the step:
    generating said first control signal.

17. The method according to claim 16, further comprising the step:
    generating said one or more second control signals.

18. The method according to claim 15, wherein step (B) generating one or more first outputs in further response to one or more second select signals.

19. The method according to claim 15, further comprising the step:
    controlling bus-matching of said data bus.

20. The method according to claim 15, further comprising the step:
    multiplexing non-redundant data bits onto said data bus.

* * * * *